(12) United States Patent
Dufilie et al.

(10) Patent No.: US 6,313,717 B1
(45) Date of Patent: Nov. 6, 2001

(54) ACOUSTIC FILTER WITH TWO DIFFERENT CHANNELS WITH COMPENSATION FOR REJECTION

(75) Inventors: Pierre Dufilie, Vernon, CT (US); Stéphane Chamaly, Mandelieu (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/374,510

(22) Filed: Aug. 16, 1999

(30) Foreign Application Priority Data

Aug. 21, 1998 (FR) .................................... 98 10630

(51) Int. Cl.$^7$ ................... H03H 9/64; H03H 3/08
(52) U.S. Cl. ............. 333/193; 333/196; 29/25.35; 310/313 B
(58) Field of Search ................. 333/193–196; 310/313 R, 313 B, 313 C, 313 D; 29/25.35

(56) References Cited

U.S. PATENT DOCUMENTS

| | | | |
|---|---|---|---|
| 3,551,837 | 12/1970 | Speiser et al. | 333/154 |
| 3,810,257 | 5/1974 | Jones et al. | 333/151 |
| 4,390,854 | 6/1983 | Colvin | 333/193 |
| 4,609,891 * | 9/1986 | Solie et al. | 333/195 |
| 5,021,699 | 6/1991 | Dufilie | 310/313 B |
| 5,264,751 | 11/1993 | Dufilie et al. | 310/313 B |
| 5,307,035 | 4/1994 | Dufilie et al. | 333/193 |
| 5,357,228 | 10/1994 | Dufilie | 333/195 |
| 5,521,565 * | 5/1996 | Anemogiannis | 333/193 X |
| 5,550,793 | 8/1996 | Dufilie | 367/164 |
| 5,936,487 | 8/1999 | Solal et al. | 333/193 |

FOREIGN PATENT DOCUMENTS 1 512 790   6/1978  (GB) .

* cited by examiner

Primary Examiner—Robert Pascal
Assistant Examiner—Barbara Summons
(74) Attorney, Agent, or Firm—Oblon, Spivak, McClelland, Maier & Neustadt, P.C.

(57) ABSTRACT

A surface acoustic wave filter includes first and second channels, each channel including at least one input transducer and one input transducer. The transfer functions of the first channel and of the second channel are in phase in the passband of the filter and in antiphase in the rejection band of the filter. The filter enables the use of frequency responses for each channel, with wide bands enabling high reduction of the size of the filter while at the same time reducing the rejection band of the total filter. Such a filter may find particular application to mobile telephony.

6 Claims, 9 Drawing Sheets

ACOUSTIC FILTER WITH TWO DIFFERENT CHANNELS WITH COMPENSATION FOR REJECTION

BACKGROUND OF THE INVENTION

1. Field of the Invention

The present invention relates to surface acoustic wave filters capable in particular of using one-directional DART type transducers.

2. Discussion of the Background

This type of transducer has the advantage of sending or receiving an acoustic wave essentially in one direction. This greatly improves the efficiency of the transducer. It is formed by a set of transducer centers and reflection centers whose distribution makes it possible to obtain very valuable filtering characteristics. However, owing to their design, DART filters are devices whose length is relatively great, typically several hundreds of $\lambda$, if $\lambda$ is the wavelength at the central frequency of operation of the device.

Consequently, a filter comprising two DART type transducers, one at input and the other at output, requires the use of a substrate whose length is appreciably greater than its width. It then becomes necessary to use a non-standard package, itself having a length appreciably greater than its width, which is difficult to incorporate into the usual systems of implantation, and which furthermore has weaknesses in torsion and deflection.

SUMMARY OF THE INVENTION

In this context, the invention proposes a surface acoustic wave filter using transducers into which there are integrated DART type transduction and reflection functions, the filter comprising two electrically connected channels, each channel comprising an input transducer and an output transducer, said channels having structures optimized so as to be able to attain very satisfactory performance levels in terms of filtering band and rejection band by reducing the length of the filter, a parameter which, at present, is decisive in terms of the cost of filters.

More specifically, an object of the invention is a surface acoustic wave filter comprising transducers, each transducer being defined by a weighting function that represents the density of the reflection and transduction within the transducer as well as the phase of the reflections and transductions. This weighting function may be achieved physically on the transducer either by a discretization method, well known to those skilled in the art, consisting of the choice, in each zone of the transducer, of a density of reflectors and a density of sources proportional to those given by the weighting function or by a so-called method of weighting by aperture consisting of the placing, in the transducer, of the sources and reflectors on an aperture given by the weighting function, said filter having a given passband and a given rejection band and comprising:

- a first channel comprising at least one first input transducer and one first output transducer defining a first transfer function, said first channel having a first resultant weighting function;
- a second channel comprising at least one second input transducer and one second output transducer defining a second transfer function, said second channel having a second resultant weighting function;
- the first and second input transducers being electrically connected to each other;
- the first and second output transducers being electrically connected to each other;

wherein:
  the resultant weighting functions of the two channels are different and such that the transfer functions of the first channel and of the second channel are in phase in the passband of the filter and in antiphase in the rejection band of the filter.

Advantageously, the input or output transducers may be identical from one channel to another to limit the problems of coupling, due to the diffraction between transducers, which generally cause the appearance of minor lobes in the rejection band of the filter.

According to one alternative embodiment of the invention, the input transducers and/or output transducers are series-connected.

They comprise a first series of electrodes connected to an external bus of a first differential input (+V), a second series of electrodes connected to an external bus of a second differential input (−V), a third series of electrodes connected to a central bus with a floating potential, said third series separating said first and second series of electrodes. The filter can also work in non-differential mode, the potential (+V) being replaced by the ground.

According to another variant of the invention, the input and/or output transducers are parallel-connected.

The transducers of the first channel comprise a first series of electrodes connected to an external bus of a first differential input (+V) and a second series of electrodes, the transducers of the second channel comprise a third series of electrodes connected to an external bus of a second differential input (−V) and a fourth series of electrodes, a sub-set of electrodes of the second series of electrodes being connected to a sub-set of electrodes of the third series of electrodes by means of connection pads, a sub-set of electrodes of the fourth series of electrodes being connected to a sub-set of electrodes of the first series of electrodes by means of connection pads.

An object of the invention is also a method for the making of a filter according to the invention with a given template, namely a given passband and a given rejection band.

This method especially comprises the following steps:
- the determining of the weighting functions of the transducers of the first channel and of the transducers of the second channel by an iterative process so as to define transfer functions of said first channel and of said second channel in phase in the passband of the filter and in antiphase in the rejection band;
- a step of discretization of the weighting functions determined beforehand to achieve electrode masks constituting the set of transducers of the first and second channels.

BRIEF DESCRIPTION OF THE DRAWINGS

The invention will be understood more clearly and other advantages shall appear from the following description given by way of a non-restrictive example with reference to the appended figures, of which.

MORE DETAILED DESCRIPTION

Figure 1:
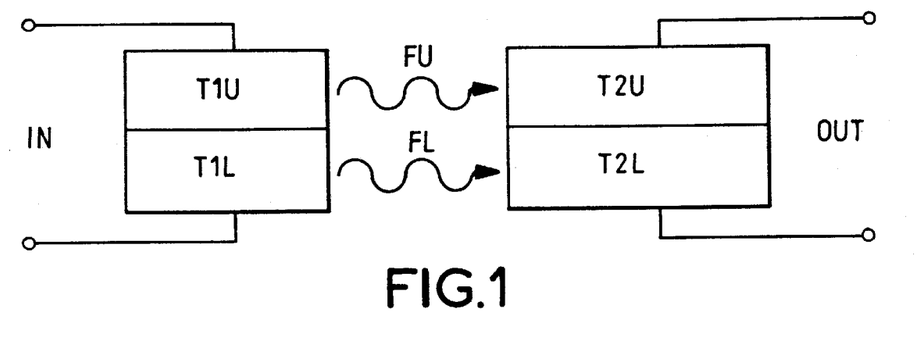
FIG. 1 gives a schematic view of a filter according to the invention comprising two channels, each having an input transducer and an output transducer.

FIG. 1 gives a general schematic view of the filter of the invention. This filter has a first channel in which the re is propagated an acoustic wave FU, this first channel comprising at least one input transducer T1U and one output transducer T2U. The filter has a second channel in which there is propagated an acoustic wave FL, this channel also comprising at least one input transducer T1L and one output transducer T2L. The input transducers T1U and T1L are electrically connected to an input referenced IN and the output transducers T2U and T2L are connected to an output referenced OUT.

The two channels have different resultant weighting functions but it may be advantageous, at input and output, to use two transducers that are identical and therefore have the same weighting function.

Figure 2:
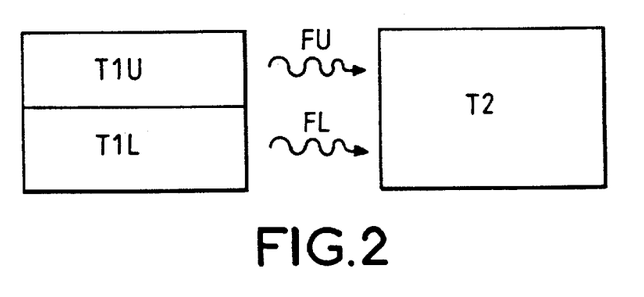
FIG. 2 gives a schematic view of a filter according to the invention comprising a single transducer at output.

The diagram shown in FIG. 2 thus represents a filter according to the invention comprising two different input transducers T1U and T1L and a single output transducer T2 equivalent to two identical transducers.

Figure 3:
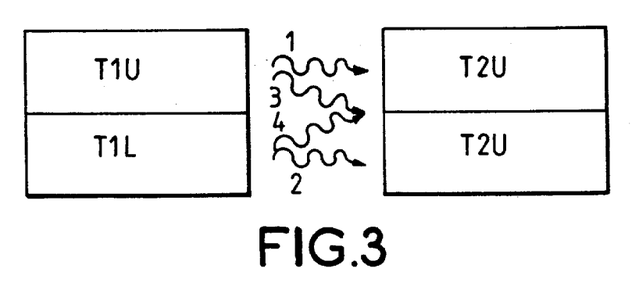
FIG. 3 illustrates the phenomena of coupling of the acoustic waves comprising different transducers at input and at output.

A structure of this kind enables the correction of a drawback of a structure in which the channels are totally different. Indeed, as shown in FIG. 3, there may be couplings between the channels because of diffraction. This results in the appearance of the acoustic waves 3 and 4 which are different from the acoustic waves 1 and 2. The amplitudes of the waves 3 and 4 are small but may get added to the amplitudes of the waves 1 and 2 and may disturb the rejection by an increase in the minor lobes.

Should there be two identical transducers T2U and T2U, the path of the acoustic wave 3 is identical to the path of the acoustic wave 1 apart from a multiplier constant. This is also the case for the paths of the waves 2 and 4. The effect of the coupling is very highly reduced for paths of the waves 3 and 4 add a contribution to the filter that is identical, apart from a constant, to that of the paths of the waves 1 and 2.

In general, to connect the input transducers T1U and T1L or the output transducers T2U and T2L, it is possible to make series connections or parallel connections. A description shall be given here below of the examples of methods enabling these types of connections.

Example of Series Connection

Figure 4:
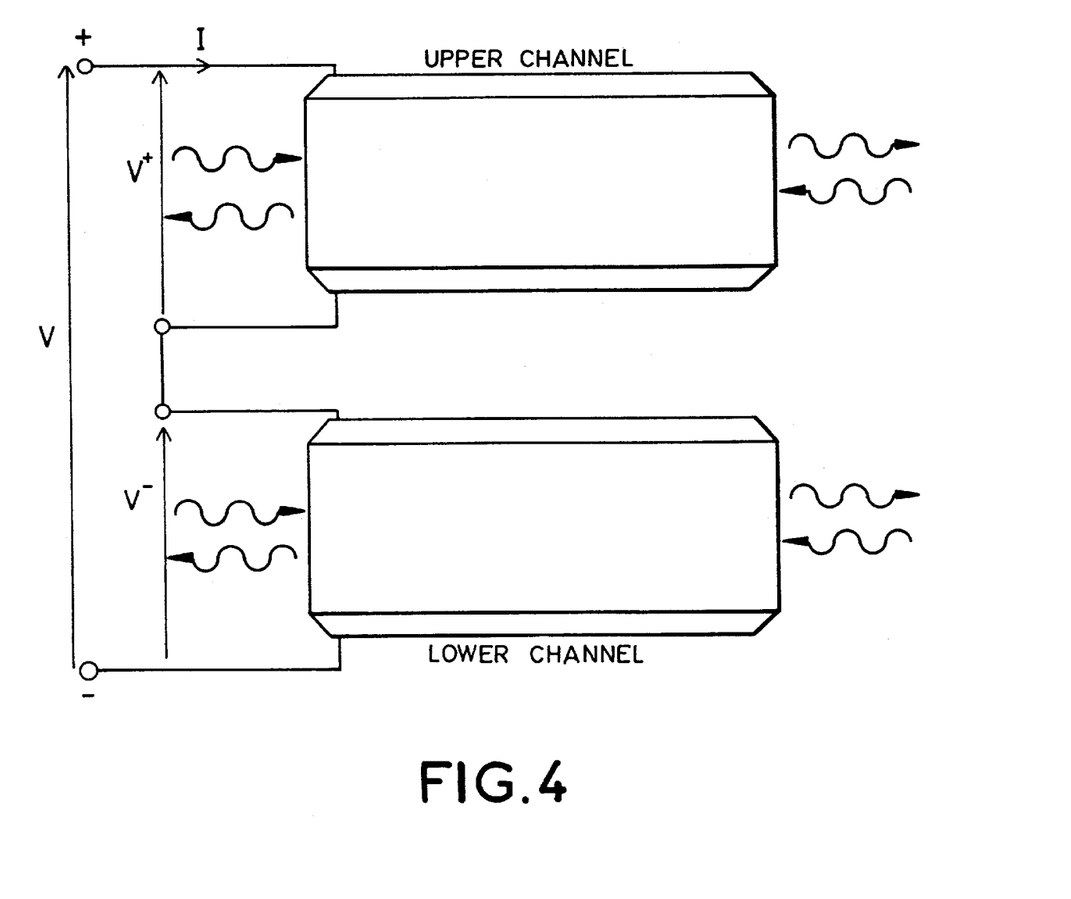
FIG. 4 illustrates two series-connected transducers.
Figure 5:
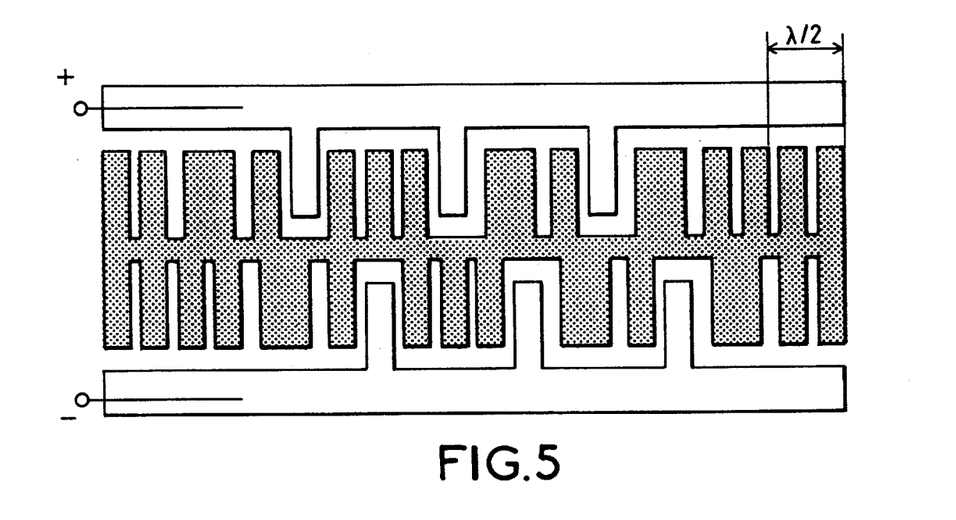
FIG. 5 illustrates a transducer divided into two identical channels offset by a half-wavelength and series-connected by a central bus with floating potential.

The physical making of the series connection takes up a known method for the making of a differential or balanced drive transducer with two identical series-connected channels described in the article by P. Dufilié, F. Roux, M. Solal, "Balanced Drive Acoustic Reflection Transducer Structure", IEEE Ultrasonics Symposium Proceedings, 1997, pp. 27–31. This method enables the conversion of a transducer which has to be driven in non-differential mode into differential mode. For this purpose, the transducer is subdivided into two identical channels that are series-connected as shown in FIG. 4. The active electrodes are connected to the external buses referenced + and − and the remaining electrodes are connected to a central bus with floating potential as shown in FIG. 5. To generate a symmetrical mode, in this type of structure, one channel is offset by one half-wavelength in relation to the other.

Figure 6:
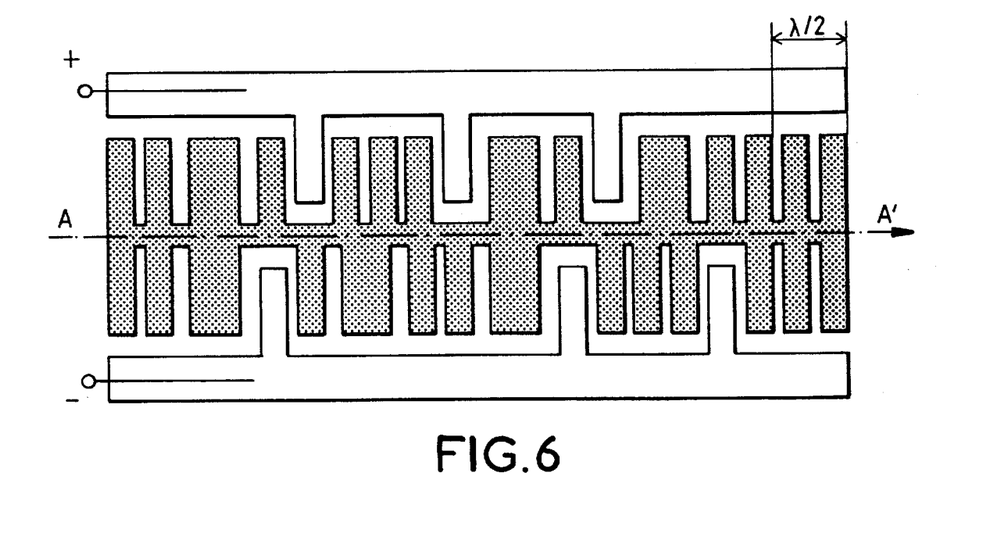
FIG. 6 illustrates two different transducers series-connected by a floating bus.

Within the framework of the invention, to obtain channels with different weightings, it is possible to again use a similar method in which the active electrodes are connected to two external buses and the remaining electrodes are connected to a central bus as illustrated in FIG. 6. Since the distribution of electrodes on either side of the median axis AA' is different, two different series-connected transducers are thus obtained. These transducers correspond to the input or output transducers used in a filter according to the invention.

Example of Parallel Connection

Figure 7:
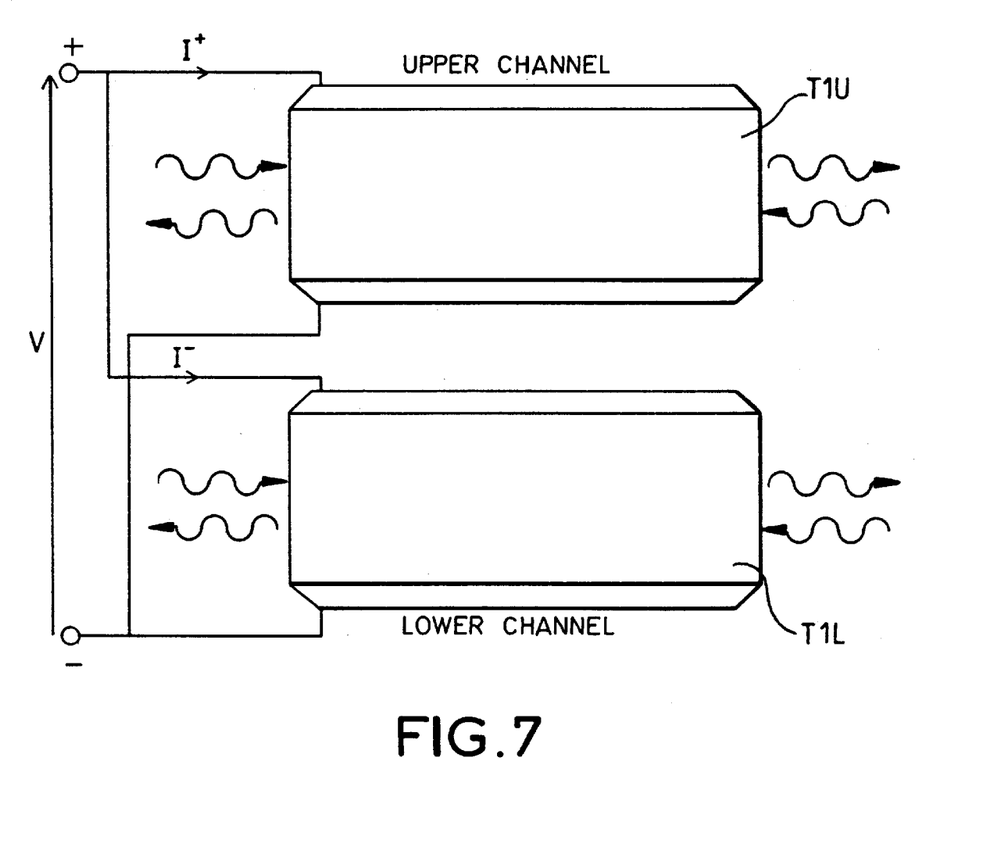
FIG. 7 illustrates two parallel-connected transducers.

As illustrated schematically in FIG. 7, the two transducers T1U and T1L are electrically parallel-connected, the active electrodes being connected to two external buses.

An exemplary parallel connection that can be used in the invention takes up a method described especially in the patent application published under number 2 740 908 and filed by the present Applicant.

Figure 8:
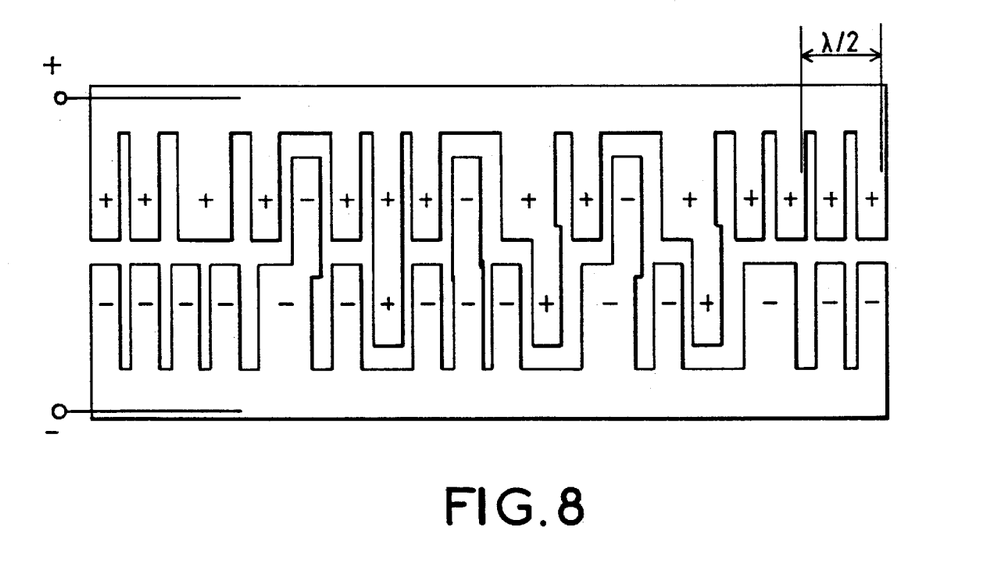
FIG. 8 illustrates two identical transducers parallel-connected and offset by a half-wavelength according to the prior art.

According to this method, illustrated in FIG. 8, the structure comprising two transducers and four connection buses is replaced by a structure having no more than two connection buses, the bus connected to the potential +V being at the top and the bus connected to the potential −V being at the bottom. In each of the channels, the electrodes are electrically connected to +V or −V, the equality of the weighting operations and the offset by a half-wavelength between channels making it possible again to connect an electrode of one channel to the bus opposite this channel by means of an electrode of the opposite channel connected to this bus.

Figure 9:
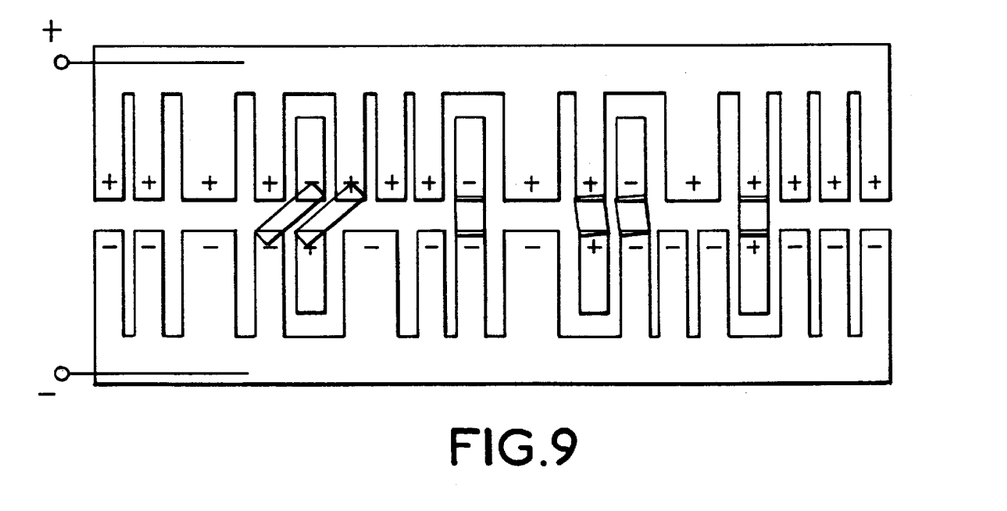
FIG. 9 illustrates two different, parallel-connected transducers, used in a filter according to the invention.

When it is sought to obtain different weighting channels, it becomes necessary to obtain the parallel connection of two different transducers. For the active electrodes, it is necessary to reduce the potential of the opposite bus as in FIG. 7. This may be done by means of the connection pads shown in FIG. 9 which thus correspond exactly to the electrical lines, plotted in FIG. 7, which illustrate the electrical connections. An algorithm may be prepared to make the connection shorter while avoiding any possible intersection. For this purpose, the method referred to here above must be adapted. Thus, to connect the electrodes of a channel to the bus opposite this channel, an electrode of the other channel connected to this bus is used with, however, a small oblique interconnection pad as shown in FIG. 9.

Example of a filter according to the invention for an application in mobile telephony with a frequency centered on 220.38 MHz.

This is a filter made on a quartz substrate in which, given the impedances brought into play, parallel connections of the transducers are made.

To make a filter of this kind, initially the weighting functions of each of the two channels are determined to obtain optimized transfer functions so as to meet the requisite characteristics, namely the characteristics of transfer functions in phase in the passband of the filter and in antiphase in the rejection band. The method of optimization may be, in particular, a Remez algorithm type method described in the articles by P. Ventura, << Synthesis of SPUDT Filters with Simultaneous Reflection and Transduction Optimization >>, IEEE Ultrasonics Symposium Proceedings, 1992, pp 71–75; P. Ventura, M. Solal, P. Dufilié,<<S. Chamaly, << A Global Optimization Procedure for SPUDT Filters >>, IEEE Ultrasonics Symposium Proceedings, 1993, pp 5–8; J.-M. Hodé, J. Desbois, P. Dufilié, M. Solal, P. Ventura, << SPUDT-Based Filters : Design Principles And Optimization >>, IEEE Ultrasonics Symposium Proceedings, 1995, pp 39–50., or by a method described by J.Franz et al., << Hybrid Optimization Techniques For Design Of SAW Filters >>, 1997 IEEE Ultrasonics Symposium pro., pp 33–36.

Figure 10A:
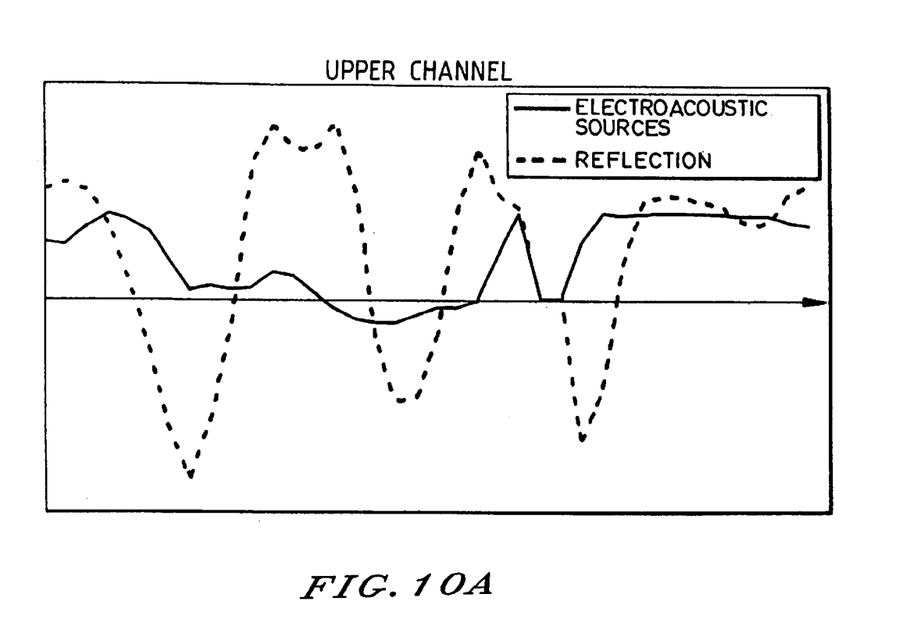
FIG. 10 illustrates the weighting functions for the two transducers of each of the channels used in an exemplary filter according to the invention working at 220.38 MHz.
Figure 10B:
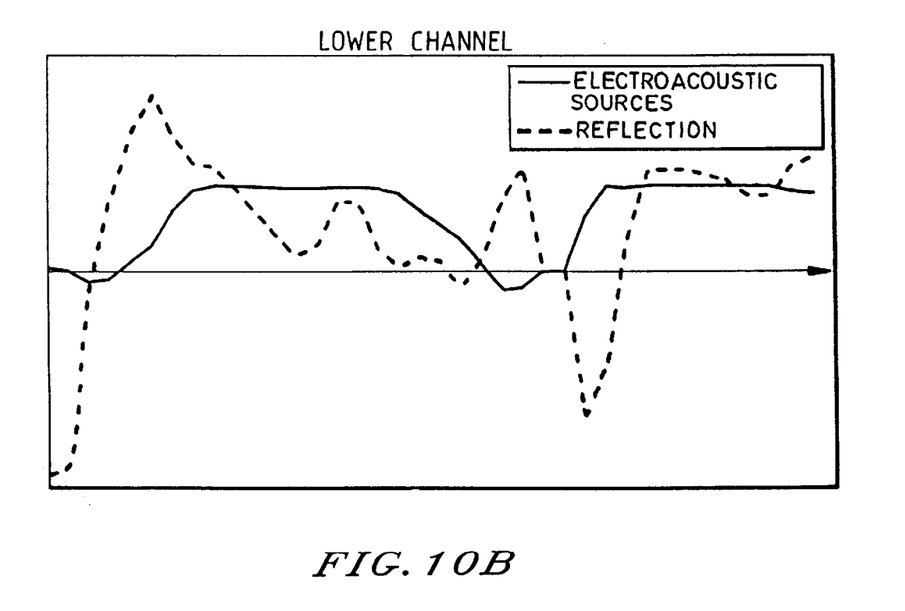

FIG. 10 illustrates the weighting functions of the two channels of the optimized filter corresponding to the transmission and reflection functions along all the channels.

Figure 11:
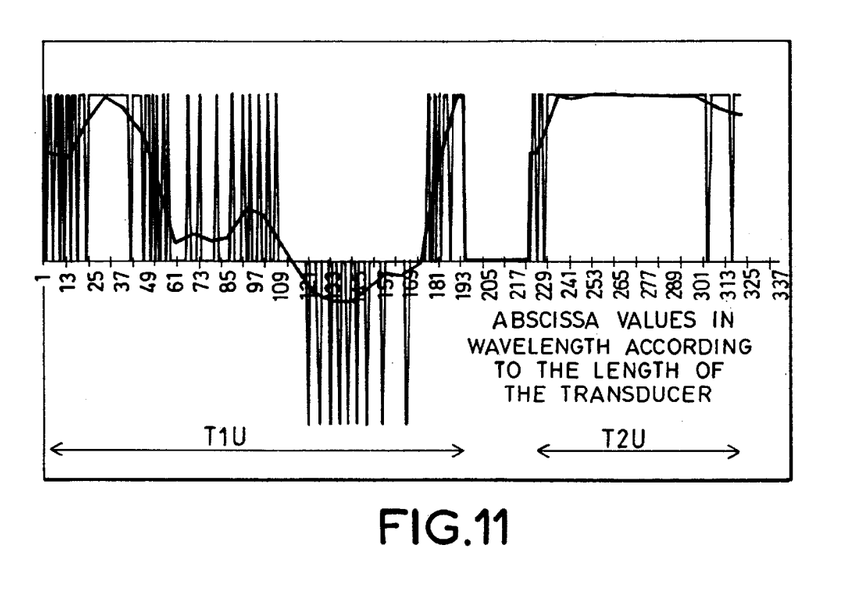
FIG. 11 illustrates the discretization of the weighting functions.

FIG. 11 illustrates the discretization of the weighting functions at the source of the transducers T1U and T2U. The same procedure is used for the reflections and for other transducers. The values taken by the discrete function indicate the potential to be applied to the electrode, namely the bus to which this electrode must be connected.

Figure 12:
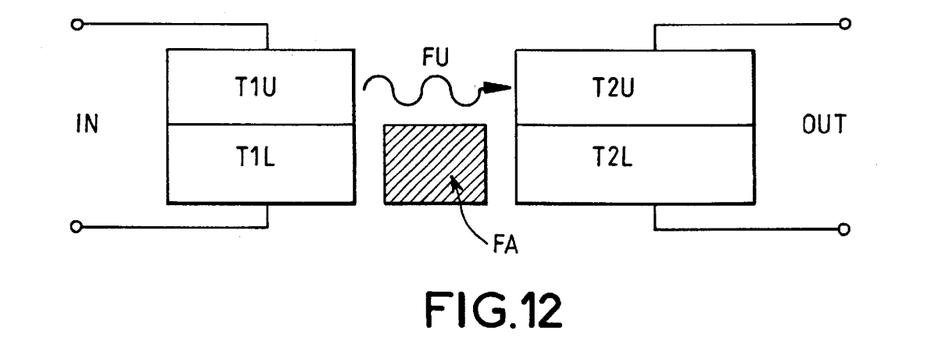
FIG. 12 illustrates the method of determining the response of an isolated channel.

FIG. 12 illustrates a method for revealing the response of the higher channel. To do so, a high acoustic attenuation FA is placed on the path of the waves of the lower channel before measuring the filter. The procedure is identical for the other channel.

Figure 13:
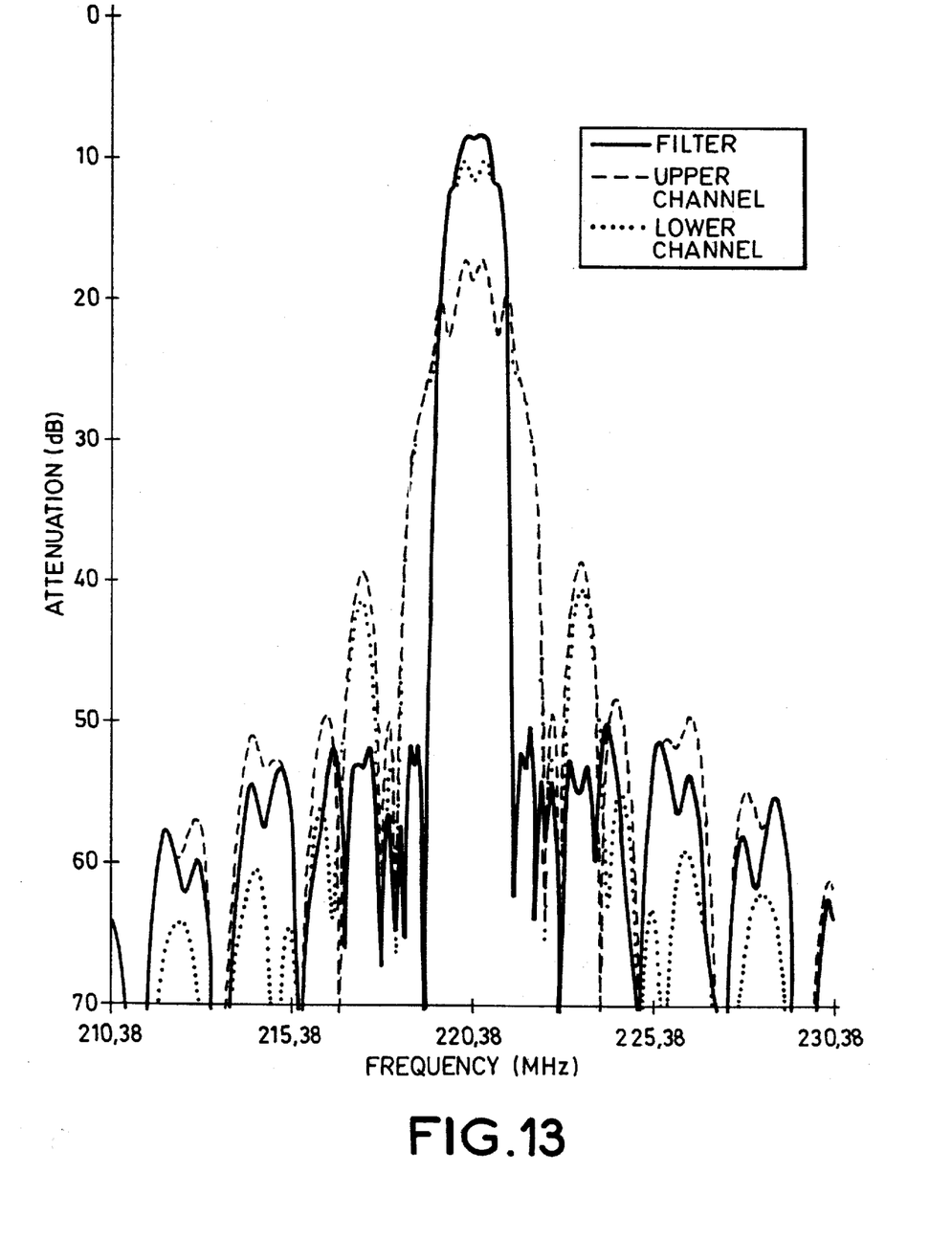
FIG. 13 illustrates the amplitudes of the transfer functions of the two channels of an exemplary filter according to the invention working at 220.38 MHz, taken in isolation, as well as the amplitude of the transfer function of the resulting filter.

FIG. 13 illustrates the amplitudes of the transfer functions of the first channel and of the second channel analyzed separately. It can be seen that the resultant transfer function of the filter is narrower and has a better shape ratio than the transfer functions of each of the two channels.

Figure 14:
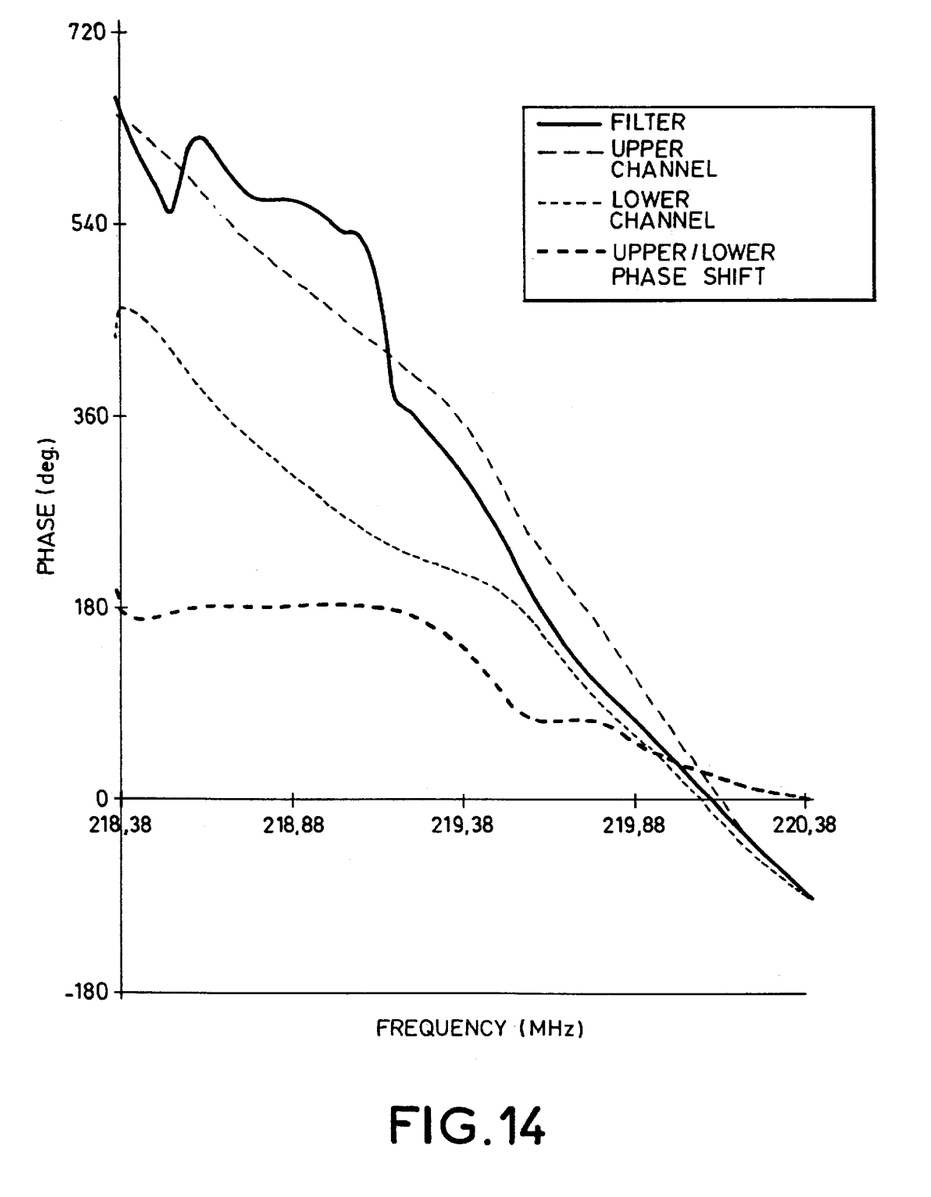
FIG. 14 illustrates the phases of the transfer functions of the two channels of an exemplary filter according to the invention working at 220.38 MHz, taken in isolation, as well as the amplitude and phase of the transfer function of the resultant filter.

FIG. 14 illustrates the phases of the transfer functions.

The explanation of this phenomenon lies in the phases of the transfer functions of the two channels. They are in phase in the vicinity of the central frequency. The amplitudes get added to each other constructively at the level of the passband.

They are in antiphase at the level of the rejection. The amplitudes get reduced, greatly improving the rejection and reducing the rejection band of the total filter.

The fact of obtaining frequency responses for each channel, with wider bands, leads to a sharp reduction in the size of the filter while at the same time retaining a narrow rejection band for the total characteristic.

It thus becomes possible to define a small-sized filter that can be integrated into a 7×5 mm² package while the prior art filters for these applications necessitates 13.3×6.5 mm² packages.

What is claimed is:

1. A surface acoustic wave filter comprising transducers, each transducer being defined by a weighting function representing a distribution of centers of reflection and centers of transduction of said transducer, said filter having a passband and a rejection band and comprising:

a first channel comprising at least one first input transducer and one first output transducer defining a first transfer function, said first channel having a first resultant weighting function;

a second channel comprising at least one second input transducer and one second output transducer defining a second transfer function, said second channel having a second resultant weighting function;

wherein the first and second input transducers are electrically connected to each other;

wherein the first and second output transducers are electrically connected to each other;

wherein the resultant weighting functions of the first and second channels are different and such that transfer functions of the first channel and of the second channel are in phase in the passband of the filter and in antiphase in the rejection band of the filter; and wherein at least one of the first and second input and output transducers are series connected.

2. A surface acoustic filter according to claim 1, wherein the first and second input transducers or the first and second output transducers have the same weighting function.

3. A surface acoustic filter according to claim 2, wherein the first and second channels are indistinguishable from each other at input or at output to realize the same weighting function.

4. A surface acoustic filter according to claim 1, wherein at least one of the first and second input and output transducers comprise a first series of electrodes connected to an external bus of a first differential or non-differential input, a second series of electrodes connected to an external bus of a second differential or non-differential input, a third series of electrodes connected to a central bus with a floating potential, said third series separating said first and second series of electrodes.

5. A method for making a filter according to any one of claims 1 to 4, further comprising:

determining the resultant weighting functions of the transducers of the first channel and of the transducers of the second channel by an iterative process so as to define transfer functions of said first channel and of said second channel in phase in the passband of the filter and in antiphase in the rejection band; and discretization the weighting functions to achieve electrode masks constituting the transducers of the first and second channels.

6. A surface acoustic wave filter comprising transducers, each transducer being defined by a weighting function representing a distribution of centers of reflection and centers of transduction of said transducer, said filter having a passband and a rejection band and comprising:

a first channel comprising at least one first input transducer and one first output transducer defining a first transfer function, said first channel having a first resultant weighting function;

a second channel comprising at least one second input transducer and one second output transducer defining a second transfer function, said second channel having a second resultant weighting function;

wherein the first and second input transducers are electrically connected to each other;

wherein the first and second output transducers are electrically connected to each other;

wherein the resultant weighting functions of the first and second channels are different and such that transfer functions of the first channel and of the second channel are in phase in the passband of the filter and in antiphase in the rejection band of the filter; and wherein central frequencies of the first and second transfer functions are substantially equal.

* * * * *